United States Patent [19]

Zuleeg et al.

[11] Patent Number: 4,679,298

[45] Date of Patent: Jul. 14, 1987

[54] METHOD OF FABRICATION OF GAAS COMPLEMENTARY ENHANCEMENT MODE JUNCTION FIELD EFFECT TRANSISTOR

[75] Inventors: Rainer Zuleeg, San Juan Capistrano; Johannes K. Notthoff, Lomita; Gary L. Troeger, Fountain Valley, all of Calif.

[73] Assignee: McDonnell Douglas Corporation, Long Beach, Calif.

[21] Appl. No.: 771,524

[22] Filed: Aug. 30, 1985

Related U.S. Application Data

[62] Division of Ser. No. 570,951, Jan. 16, 1984, Pat. No. 4,568,957.

[51] Int. Cl.$^4$ .............................................. H01L 21/00
[52] U.S. Cl. ................................ 29/571; 29/576 B; 29/577 C; 29/590; 29/578; 148/1.5; 148/186; 148/DIG. 84
[58] Field of Search ............... 29/571, 576 B, 578; 148/1.5, DIG. 82, DIG. 83, DIG. 84, DIG. 88, DIG. 136; 357/22 F, 42, 51, 91; 427/38, 85; 250/492.2

[56] References Cited

U.S. PATENT DOCUMENTS

| 4,452,646 | 6/1984 | Zuleeg | 148/1.5 |
| 4,568,957 | 2/1986 | Zuleeg et al. | 357/22 |

OTHER PUBLICATIONS

Troeger et al, "Fully Ion Implanted Planar GaAs E-J-FET Process", *IEDM Tech. Dig*, 1979, pp. 497–500.
Ghondi, *VLSI Fabrication Principles Silicon and Gallium Arsenide*, John Wiley & Sons, 1983, New York, pp. 593–595.
Troeger et al, "A Radiation-Hard Low-Power GaAs Static RAM Using E-JFET DCFL", *GaAs IC Symp Tech. Dig.*, 1983, paper 20.
Zuleeg et al, "Femtojoule High-Speed Planar GaAs E-JFET Logic", IEEE *Trans. Electron Devices*, vol. ED-25, pp. 628–639, Jun. 1978.

*Primary Examiner*—Brian E. Hearn
*Assistant Examiner*—Chi-Tso Huang
*Attorney, Agent, or Firm*—Gregory A. Cone; George W. Finch; Donald L. Royer

[57] ABSTRACT

Ultra low-power GaAs complementary junction field effect transistors are implemented in the design of complementary integrated circuits using a planar technology in conjunction with multiple and selective ion implantation. Both junction FETs, namely the p and n channel devices, are enhancement mode devices and biased in the forward direction thus leading to the advantageous DCFL (directly coupled field effect transistor logic) with one power supply, low power dissipation and high packing densities, all prerequisites for VLSI (very large scale integration).

4 Claims, 15 Drawing Figures

METHOD OF FABRICATION OF GAAS COMPLEMENTARY ENHANCEMENT MODE JUNCTION FIELD EFFECT TRANSISTOR

This is a division of application Ser. No. 570,951, filed Jan. 16, 1984, now U.S. Pat. No. 4,568,957.

BACKGROUND OF THE INVENTION

This invention relates to gallium arsenide junction field effect transistors. More particularly this invention relates to complementary enhancement mode junction field effect transistors formed by planar processing techniques utilizing multiple ion implantations.

Gallium arsenide field effect transistors are a farily recent development in semiconductor technology. Two different versions have emerged and have been developed more or less in parallel. One is the gallium arsenide Schottky-barrier FET or MESFET. The other is the enhancement mode junction field effect transistor (E-JFET) which is of primary interest herein. Either may be advantageously used for direct coupled logic (DCL) circuits. This E-JFET design leads to a reasonably low power integrated circuit technology with 100 microwatt per gate and a propagation delay time of 100 ps, i.e., delay-power product of 10 fJ when used in conjunction with a 5K ohm resistive load. Although this low power dissipation per gate offers integration capability up to very large scale integration (VLSI) with 10,000 gates or more, for complex memory applications even lower power dissipations are demanded. With a resistive load memory cell using E-JFET drivers, a low power of 1–2 microwatts per cell has been achieved with a 256-bit static Random Access Memory (RAM) by using a 1M ohm resistive load. This design path soon reaches a dead end due to subthreshold leakage currents which prevent lower power levels with resistive loads. Another low power 256-bit static RAM was designed with depletion mode (MESFET's) which utilizes a "power concentration" design approach for a 9 microwatts per cell power dissipation level.

For many important applications, ultra low-power circuits are necessary. One such application is for large scale memories used in space vehicles. In the case using n channel enhancement mode gallium arsenide JFET's and ion implanted resistive loads mentioned above, the best practical design resulted in a power dissipation of about two microwatts per cell which was several times higher than the design goal. Unfortunately, no existing prior art gallium arsenide MESFET or JFET technology can substantially improve upon this power dissipation level because of high subthreshold currents of the field effect transistors with only n channel device circuit design. Also the difficulty in obtaining a reasonable barrier height using GaAs MESFET technology prevents the creation of a useful complementary p channel device.

SUMMARY OF THE INVENTION

It is therefore an object of this invention to provide for gallium arsenide enhancement JFET circuits utilizing complementary transistors which may be fabricated to have an extremely low power dissipation level. To this end, we have invented a process for forming such complementary transistors utilizing exclusively ion implantation techniques in conjunction with conventional planar processing. The gallium arsenide structure containing the complementary enhancement mode junction field effect transistors contains at least both n- and p channel enhancement mode JFET's. These JFET's are formed in a semi-insulating gallium arsenide substrate. The n channel JFET's are formed by first ion implanting n type impurity ions into source and drain regions of the substrate, followed by a second ion implantation of further n type impurity ions into the channel region between the respective source and drain regions with this second implantation overlapping onto the first implantation in the source and drain regions. This is followed by the formation of a gate region produced by exposing a portion of the channel region to a third ion implantation of p type impurity ions extending partially into the n type channel region. The p channel JFET's are formed by a similar process in which the p channel region is formed in a first step by an ion implantation of p type impurity ions into a selected region of the substrate, then the source and drain regions are formed by a further p type ion implantation into respective space-apart areas of the p channel region with the remainder of the p channel region being protected from this ion implantation. The n+gate region is formed by exposing a portion of the channel region intermediate the source and drain regions to an ion implantation of n type impurity ions which extend partially into the p channel. The geometry of the p channel JFET is appropriately adjusted to achieve compatible electrical characteristics with the n channel JFET in view of the large difference between electron and hole mobilities in these ion implanted gallium arsenide structures. Both JFET structures have their gate structures formed by a double ion implantation, that is, a channel implant of one impurity type followed by a gate implant of the opposite impurity type. Additionally, both p and n channel resistive elements may also be fabricated utilizing our basic processing method. In each case, first and second spaced apart contact regions are formed by ion implantations very similar to those utilized to form the source and drain regions of the respective p- and n channel JFET structures. The resistive load is produced by a second ion implantation into an intermediate resistive channel region between the first and second contact regions such that the ion dose into this region is adjusted such that the desired resistance is produced for the p and n resistive elements. It was found to be especially helpful to conduct all of the ion implantations through a protective layer of silicon nitride ($Si_3N_4$). This protective layer is of course removed in at least those areas which serve as electrical contacts for the various source, drain, gate, and first and second contact regions for the various JFET and resistive element structures. Although the complementary E-JFET's are particularly useful for ultra low-power memory applications, the complementary processing techniques can be used to create higher power complementary JFET circuits as well.

DETAILED DESCRIPTION OF THE INVENTION

Figure 1:
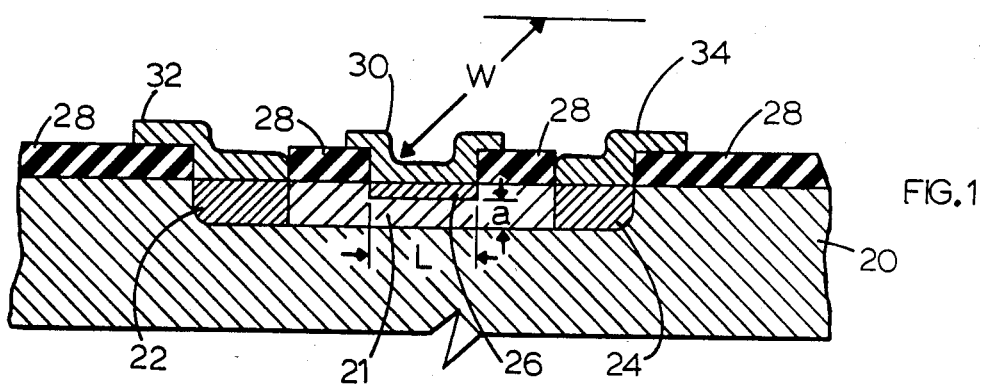
FIG. 1 is a cross-sectional view of a p channel enhancement mode junction field effect transistor.

The gallium arsenide JFET device is similar to the MESFET in that in both devices a depletion layer modulates the conductivity in an n type channel between source and drain contacts. The difference arises in the manner in which the depletion layer is generated. The MESFET utilizes the built-in voltage generated by a metal-to-GaAs Schottky-barrier, and the JFET uses the built-in voltage of a P−N junction. For the prior art n channel devices, the source and drain areas are n+regions. The channel area has n type conductivity, and the gate region is a p+region. The depletion region is generated at the p+n junction at the interface between the p+gate and the n type channel. The threshold voltage of a JFET is adjustable by varying the depth of the P+N junction. The deeper the P+N junction, the more effectively the channel is pinched off and the higher the resulting threshold voltage. In the case of the ion implanted JFET, the deeper the gate implant, the higher the threshold.

The theory of operation for n channel GaAs JFET's is farily well known. An analogy to such n channel theory, the voltage-current relation and saturation is given for the p channel FET by $$I_{DS} = -K_p'(W/L)(V_G - V_{TP})^2$$

where the negative sign is for the hole current and the gate voltage $V_G$ is negative for enhancement-mode operation and the threshold voltage $V_{TP}$ of the device is also negative. The geometrical device parameters W and L are the circuit designer's choice whereas the parameters $K_p'$ and $V_{TP}$ are process and material related. The $K_p'$ for the p channel device should be about 10 times smaller than the $K_p'$ for the n channel device. This can be inferred from the definition of $K_p'$ which is $$K_p' = \frac{\epsilon \epsilon_0 \mu_p}{2a}$$

with $\mu_p$ the hole mobility instead of the electron mobility. For the same channel height a, one expects the $K_n'/K_p'$ ratio to correspond to the $\mu_n/\mu_p$, which is about 10 for a peak channel doping $N_A = 1 \times 10^{17}$ cm$^{-3}$ with a corresponding mobility $\mu_p = 300$ cm$^{2/Vs}$. The threshold voltage of the p channel device is defined by $$V_{TP} = -(V_B - V_P)$$

where $V_B$ is the built-in voltage of the n+p junction and the theoretical punchthrough voltage $V_P$ is given by $$V_p = \frac{a}{\epsilon \epsilon_o} \int_{x_j}^{\infty} N_A(x)x dx$$

with $N_{A(x)}$ the profile of the ion-implanted acceptor impurity after junction formation by the donor implantation at a depth, $x_j$ with a geometry of L=1 micron and W=10 microns, $K_p'$ values of 0.5 to $1 \times 10^{-5}$ A/V$_2$ were obtained. Representative n channel devices give $K_n' = 1 \times 10^{31}$ $^4$ A/V$_2$. Consequently for a p channel E-JFET with the same drain current as the n channel device, the W/L ratio has to be increased by a factor $K_n'/K_p' \cong \mu_n/\mu_p \cong 10$. This results in larger device capacitances than those for n channel devices and consequently reduced switching speed. The tradeoff is, then, the benefit of a lower power dissipation level balanced against the detriment of the longer propagation delay time caused by the larger capacitances.

In silicon complementary transistor technology the ratio of effective channel electron to hole mobility is about 2 to 3, making the complementary circuit design more balanced in device size than the comparable circuits presented herein for gallium arsenide. However, the optimized gallium arsenide complementary gate, in spite of the very different electron and hole mobility values, has shown impressive propagation delay times of 500-800 ps with a total power dissipation of 100 microwatts per gate and operation at 100 MHz clock rates. This makes the gallium arsenide complementary circuit quite useful when very low power consumption is mandatory as in VLSI static random access memories (SRAM). It should be noted that the gallium arsenide complementary circuitry is rather unique in its design because it is the first and only technology which uses the forward bias operation of both the n channel and p channel junction field effect transistors. This is very advantageous for DCFL and therefore ultra low-power operation. The logic swing has to be limited to about 0.8 to 1.0 volts, and low supply voltages in the range of 0.8 to 1.1 volts are necessary. Since the static power dissipation is only 50 to 100 nW for small gate width devices (5-20 microns), the dynamic power dissipation, controlled by the expression $P_{DYN} = fD_{DD}^2 C_N$, is the dominant power parameter. For a clock frequency of 1 GHz, a supply voltage of $V_{DD} = 1.0$ volts and the node or load capacitance of $C_N = 100$ fF, the dynamic power dissipation is 100 microwatts.

The above theoretical description of the operation of the p channel E-JFET may be better understood by reference to FIG. 1. The semi-insulating undoped gallium arsenide substrate 20 is shown with the p+regions 22 and 24 forming the source and drain for the JFET with the intermediate p type conductivity channel region 21 disposed intermediate the source and drain regions. Above the middle portion of the channel region 21 is found the implanted n+gate region 26. The substrate is capped by a layer of silicon nitride 28 except for the gaps therein over the electrical contact areas for the underlying structures in the substrate. Atop the gate region is found the electrical gate contact 30 which here is formed of a sintered Ge-Au alloy. Atop the source and drain regions 22 and 24 are the source and drain electrical contacts 32 and 34 which are here formed of a sintered Pt-Au alloy. The critical channel dimensions for width (W), length (L), and depth (a), are as indicated on the drawing figure.

Figure 2:
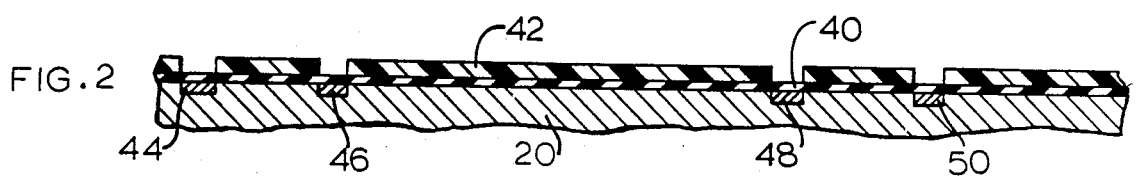
FIG. 2 is a cross-sectional view showing an early step in the processing sequence of this invention, specifically the n+implant step which forms the source and drain regions for the n channel JFET and the first and second contact regions for the n type resistor.
Figure 3:
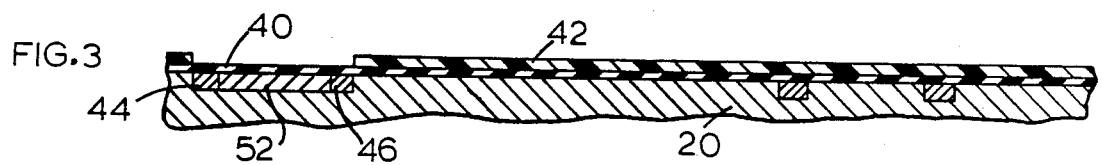
FIG. 3 is a cross-sectional view showing a succeeding processing step, specifically the n channel ion implantation step.
Figure 4:
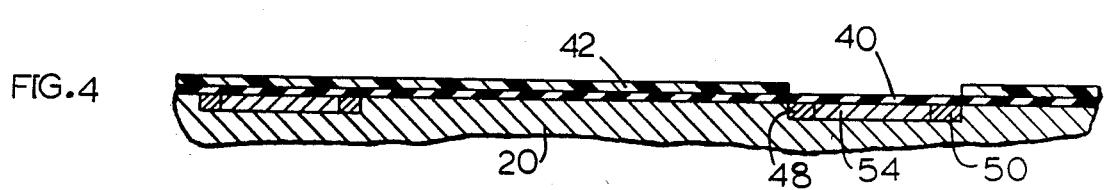
FIG. 4 is a cross-sectional view of a succeeding step to FIG. 3 in the processing sequence of this invention, specifically the resistive channel implantation for the n type resistor.
Figure 5:
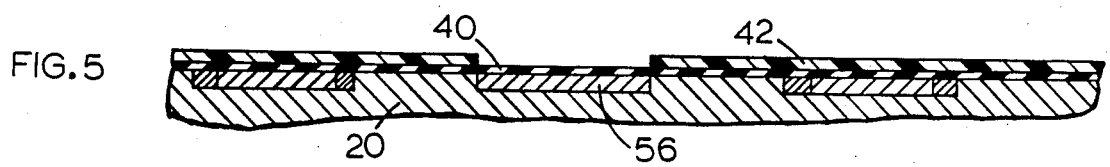
FIG. 5 is a cross-sectional view of a succeeding step to that shown in FIG. 4 for the process of this invention, specifically the initial p channel region ion implantation step.
Figure 6:
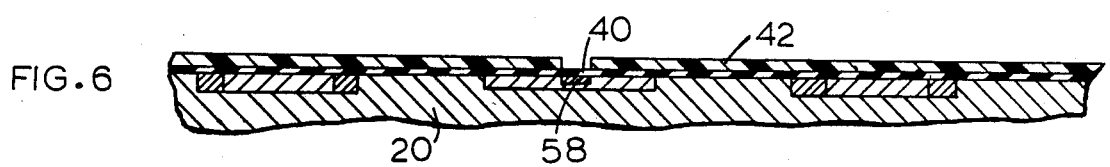
FIG. 6 is a cross-sectional view showing a succeeding step in the processing sequence to that shown in FIG. 5, specifically the ion implantation step wherein the n+gate region in the p channel JFET is formed.
Figure 7:
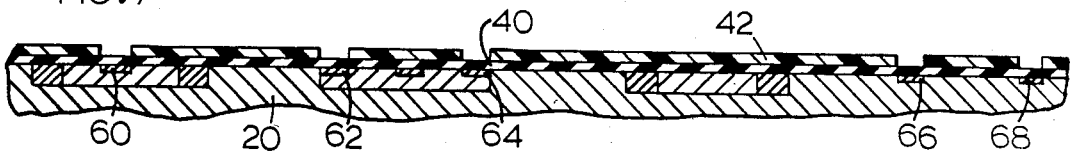
FIG. 7 is a cross-sectional view of a processing step succeeding that shown in FIG. 6, specifically the ion implantation which forms the p+gate region in the n channel JFET and also the first and second contact regions for the p type resistor.
Figure 8:
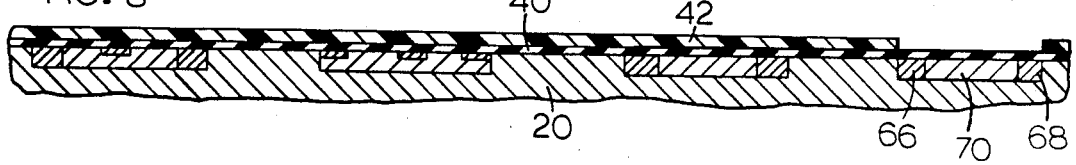
FIG. 8 is a cross-sectional view of a succeeding process step to that found in FIG. 7 for the present invention, specifically the ion implantation of p type impurities to form the resistive load channel for the p type resistor.

The process which produces the structures of this invention may be best understood by reference to FIGS. 2-12, which show the most important stages in the processing sequence. It should be understood that the following detailed description applies only to a single preferred embodiment of the invention, and that the true scope of the invention is to be found in the appended claims. In a preliminary series of unillustrated steps, wafers from selected undoped gallium arsenide ingots are processed to remove surface contaminants and polishing damage. The next step is to deposit a layer of silicon nitride approximately 1000 angstroms in thickness on top of the substrate which serves both to protect the gallium arsenide surface during processing steps and also functions as part of the annealing cap. In FIG. 2 a positive photoresist layer 42 has been laid down atop the silicon nitride protective layer 40 which in turn covers the substrate 20. Gaps in the photoresist layer 42 expose the underlying substrate to an ion implantation step using $^{29}Si+$ n type dopant to form n+regions in the substrate. These regions are the source 44 and drain 46 regions for the n channel JFET and the first 48 and second 50 contact areas for the n type resistor. Following this the photoresist is then stripped off and a new photoresist layer is emplaced which exposes all of the functional area of the n channel JFET to a second ion implantation of the n type dopant to form the n channel region 52 which is intermediate the source 42 and drain 46 regions for the n channel JFET as shown in FIG. 3. This photoresist layer is then stripped off and another photoresist layer 42 is emplaced which exposes the functional area of the n type resistor to another ion implantation of the n type dopant to form the (n−) region 54 intermediate the first 48 and second 50 contact areas of the n type resistor as shown in FIG. 4. This (n−) region 54 forms the actual resistive load element for the n type resistor. This photoresist layer is then stripped off and another photoresist layer is laid down which then exposes the functional area for the p channel JFET to an ion implantation of p type dopant, herein the $^{24}Mg+$ ion. This ion implantation into the substrate 20 forms the channel region 56 for the p channel JFET as shown in FIG. 5. This photoresist layer is then stripped off and another photoresist 42 is emplaced which exposes the n+gate region of the p channel JFET to an n+ion implantation which forms the gate region 58 as shown in FIG. 6. This photoresist layer is then stripped off and another photoresist 42 is emplaced which exposes the various regions of the substrate to a p+ion implantation as shown in FIG. 7. These ion implantations form the p+gate region 60 for the n channel JFET, the source 62 and drain 64 p+regions for the p channel JFET, and the first 66 and second 68 contact areas for the p type resistor. This layer of photoresist is then removed and a new photoresist layer is emplaced which exposes the functional area of the p type resistor to a (p−) ion implantation as shown in FIG. 8. This (p−) ion implantation forms the resistive channel region 70 which acts as the resistive load element for the p type resistor. With this step the impurity doping of the structures is complete insofar as the n and p channel JFET's and n type and p type resistors are concerned. All the impurity doping for these elements has been conducted exclusively by ion implantation which gives important advantages in respect to minimizing feature size due to the reduction and lateral spreading of the dopants as compared to prior art diffusion doping processes. This is not to require that all peripheral circuits on a wafer or chip be formed by ion implantation exclusively however. Although the doping in this example utilized silicon ions exclusively, this does not mean to imply that other ions such as selenium could not be used. The implantation energies and ion dosages for the various implantation steps are as follows:

for the n channel JFET the n+region is implanted at 185 KeV at $1.6 \times 10^{13}/cm^2$, the n channel region is implanted at 185 KeV at $1.1 \times 10^{13}/cm^2$, and the p+gate region is implanted at 80 to 100 KeV at $1 \times 10^{14}/cm^2$;

for the p channel JFET the p+regions are implanted at 80 to 100 KeV at $1 \times 10^{14}/cm^2$, the p channel region is implanted at 185 KeV at $5 \times 10^{12}/cm^2$ and the n+gate region is implanted at 100 to 130 KeV at $5 \times 10^{13}/cm^2$; for the n type resistor the n+regions are implanted at 185 KeV at $1.6 \times 10^{13}/cm^2$, and the (n−) resistive load channel is formed with an implant at 185 KeV at $8 \times 10^{12}/cm^2$; and the p type resistor is formed with the p+regions implanted at 80 to 100 KeV at $1 \times 10^{14}/cm^2$, and the (p−) resisitve load channel being implanted at 185 KeV at $2-8 \times 10^{12}/cm^2$. These particular implantation parameters should not be taken as absolutes since the optimum dosages will vary from machine to machine even within the same laboratory. Also, the dimensions of the various gates and channels in the devices vary as a function of their placement in the overall circuit design. For example, the length of the gates in the memory section of the chip for this specific embodiment is 1 micron, and the width of the gates varies from 5 to about 10. However, in the output buffer stages the gate width is over 100 microns. The annealing conditions are 735° C. for 15 minutes. The annealing is conducted after the ion implantations have been completed. The utilization of the silicon nitride protective layer discussed above is of particular significance to this invention. Of course, one of the major goals in any semi-conductor fabrication process is to be able to produce individual devices with consistent operating parameters between one another. As the processing moves into VLSI scale, literally thousands of different devices must properly interact to form a properly functioning chip. For a variety of reasons, it is almost impossible to achieve consistent results and acceptable yields when fabricating large scale gallium arsenide circuits when using diffusion processing. Hence, ion implantation techniques are necessary. However, ion implantation techniques present their own array of problems. One of them is that a typical ion implantation only penetrates to about a depth of 1,000 angstroms into the substrate. Since each atomic layer in the substrate is only about 5 angstroms in thickness, this means that the implanted impurity dopants must be accurately positioned in only about 200 atomic layers. Therefore, there is very little room for error in the process. With prior ion implantation techniques in gallium arsenide processing, it was apparent that significant variations in implantation depth were occurring which adversely affected the consistency of parameters between devices. The inventors herein have discovered that the emplacement of the silicon nitride protective layer of about 1,000 anstroms thickness provides a consistent and fixed depth reference for the ion implantations. This is because the silicon nitride layer provides a protective cap over the underlying gallium arsenide substrate. This cap protects the substrate from attack and erosion which would otherwise occur during the various processing steps such as the chemical erosion which occurs when the various layers of photoresist are emplaced and stripped off as well as the electrical damage from the ion implantation itself which would act to cause further subsequent erosion were it not for the emplacement of the silicon nitride protective layer. The protective layer itself is relatively unaffected by any of these erosion processes. This being the case, the ion implantation profile remains consistent throughout the processing steps since the depth of the silicon nitride layer remains unaffected and the underlying substrate is also uneroded. This should be contrasted with a prior art ion implantation processes in which different erosion conditions over the surface of a wafer would result in ion implantations into one portion of the wafer going deeper into the substrate in the eroded regions that would the ion implantations in other portions of the wafer which were relatively uneroded. Such depth variations appear to be a major cause of the inconsistent results in prior art ion implantations in gallium arsenide large-scale circuits.

Figure 9:
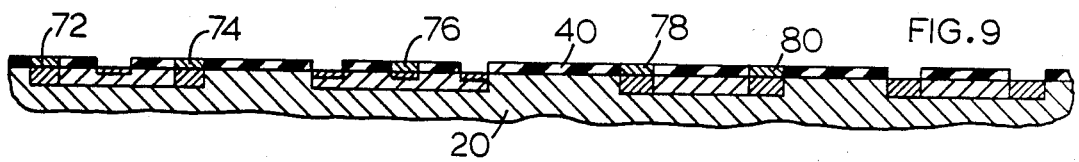
FIG. 9 is a cross-sectional view showing a succeeding processing step to that shown in FIG. 8 wherein alloyed AuGe contacts are emplaced above the n+impurity regions which form the source and drain regions of the n channel JFET, the gate region of the p channel JFET, and the first and second contact regions for the n type resistor.
Figure 10:
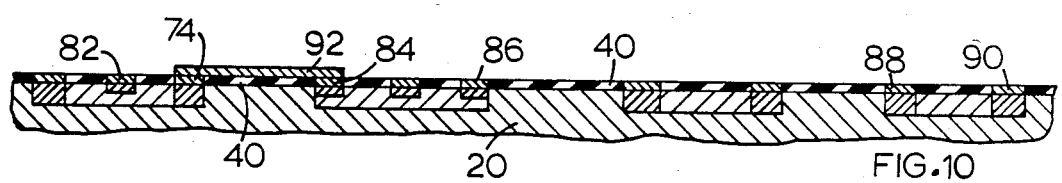
FIG. 10 is a cross-sectional view showing a succeeding step to that shown in FIG. 9 for the processing of the present invention, specifically the step wherein the contacts to the p+regions are emplaced combined with the emplacement of the first interconnect metallization.
Figure 11:
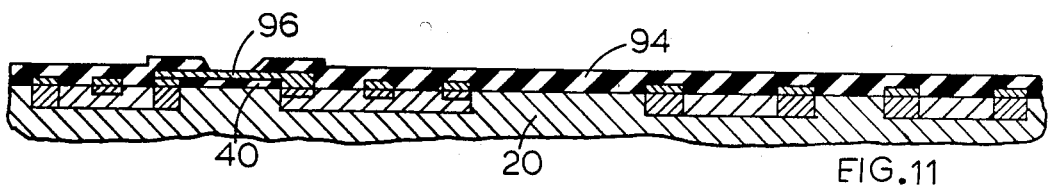
FIG. 11 is a cross-sectional view showing a succeeding step to that shown in FIG. 10, specifically the emplacement and subsequent reactive ion beam etching of a thick silicon nitride layer atop the first interconnect metallization which exposes a via area for contacting with a subsequent second interconnect metallization.
Figure 12:
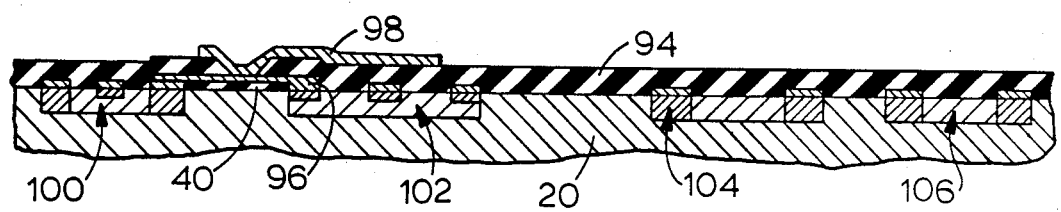
FIG. 12 is a cross-sectional view showing a succeeding processing step to that shown in FIG. 11 wherein a second interconnect metallization is emplaced atop the nitride layer shown in FIG. 11, the metallization consisting of sputtered PtAu patterned with ion milling as in FIG. 10.

In FIG. 9 the photoresist layer has been stripped away and the protective silicon nitride layer 40 has also been stripped away in those areas overlying the various contact regions as shown. FIG. 9 shows the stage in the processing immediately after the emplacement of an alloyed gold germanium contact over the n+regions. Over these regions are the source 72 and drain 74 contacts for the n channel JFET, the gate contact 76 for the p channel JFET and the first 78 and second 80 contact for the n type resistor. FIG. 10 shows the emplacement of a gold platinum alloy over the remaining p+contact areas as well as a deposition of a first interconnect metallization, here done with the same alloy. These contacts shown in FIG. 10 are the gate contact 82 of the n channel JFET, the source 84 and drain 86 contacts for the p channel JFET, and the first 88 and second 90 contact areas of the p type resistor. Also shown in FIG. 10 is the emplacement of the first interconnect layer 92 here shown as an interconnection between the source contact 84 for the p channel JFET and the drain contact 74 of the n channel JFET. FIG. 11 shows a succeeding step in which a thick layer of silicon nitride 94 has been deposited atop the wafer shown in the processing stage in FIG. 10 and further after a window has been milled into the nitride to expose the via area 96. In FIG. 12 a succeeding step has been illustrated in which the second interconnect metallization has been emplaced. The particular interconnect shown is that of the metallization shown as 98 which connects the second interconnect layer with the first interconnect layer illustrated in FIGS. 10 and 11 through the via window 96. FIG. 12 then shows a final step in the processing sequence in which the n channel JFET 100, the p channel JFET 102, the n type resistor 104 and the p type resistor 106 have achieved their final configurations.

Figure 13:
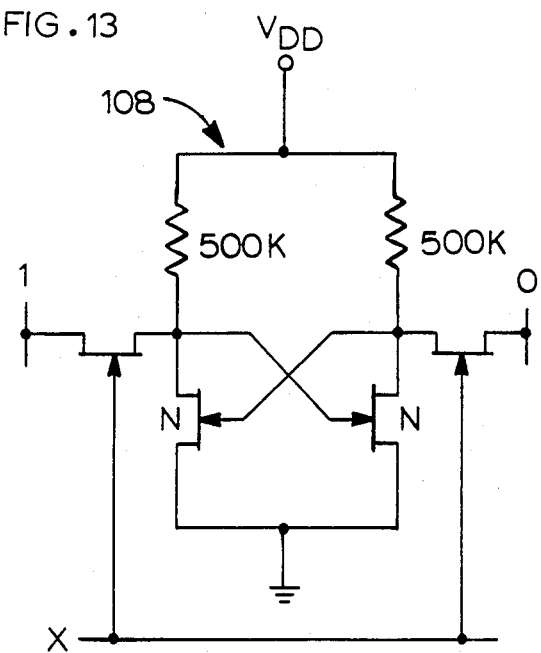
FIG. 13 is a schematic circuit diagram showing a prior art resistive load enhancement JFET memory cell.
Figure 14:
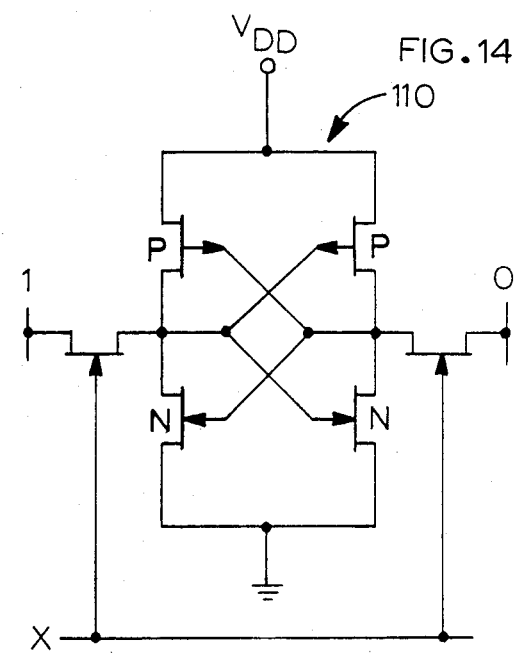
FIG. 14 is a schematic circuit diagram of a complementary enhancement JFET memory cell useful as one implementation of the complementary E-JFET's of this invention.
Figure 15:
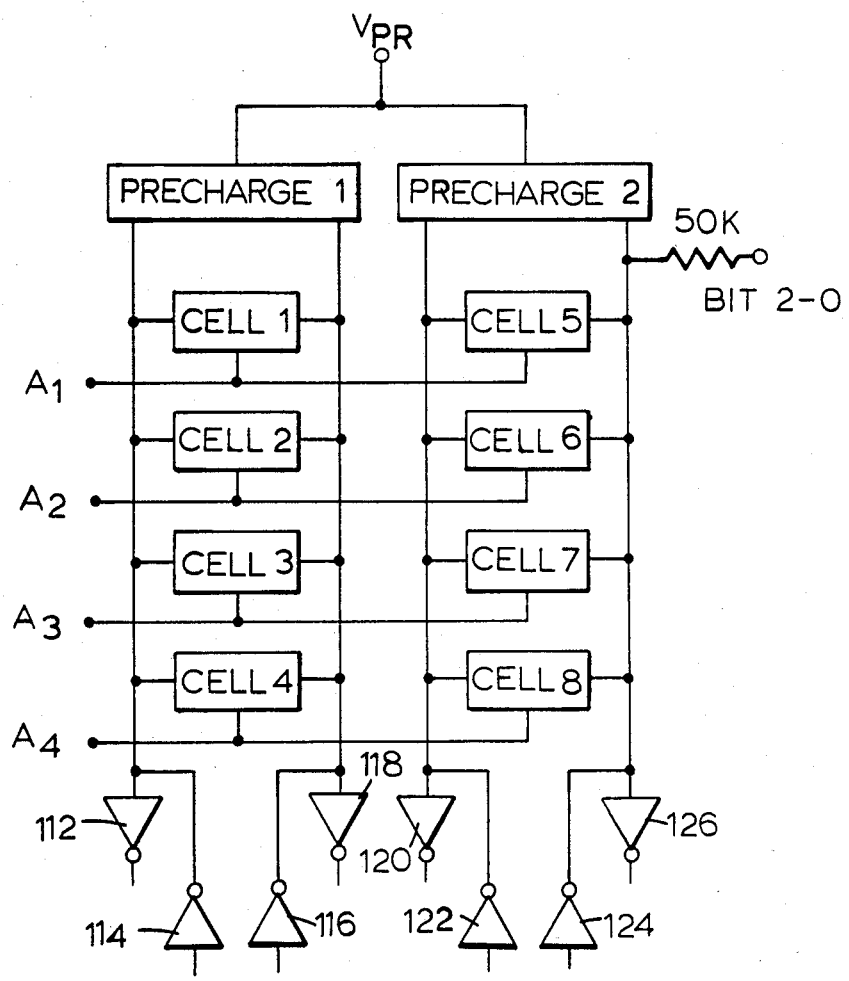
FIG. 15 is a logic diagram of an 8-bit memory cell array used to test the individual complementary memory cells shown in FIG. 14.

The application of the p channel E-JFET to form a complementary circuit was evaluated for an ultra low-power static RAM design by replacing the resistive load element shown in the prior art memory cell 108 in FIG. 13. This cell has been discussed briefly above and was capable of operating with a power of about 1-2 microwatts per cell. The resistive load elements were replaced with p channel E-JFET's to form the complementary memory cell structure shown as circuit 110 in FIG. 14. Low power operation of the complementary memory cell was evaluated with an 8-bit memory array chip which was designed with 24 inverters. The logic diagram of the memory cell array chip is shown in FIG. 15. Each of the individual cells shown in FIG. 14 are found on FIG. 15 as cells 1-8. The inverters along the bottom portion of the logic diagram are a Read 1 inverter 112, a Write 0 inverter 114, a Write 1 inverter 116, a Read 0 inverter 118, a Read 1 inverter 120, a Write 0 inverter 122, a Write 1 inverter 124, a Read 0 inverter 126. Three circuit chips were tested with the following dc parameters:

| CIRCUIT | $V_{DD}$ | $I_{DD}$ | $P_{TOTAL}$ | $P/INVERTER$ |
|---|---|---|---|---|
| 1 | 0.7 V | 3.0 μA | 2.1 μW | 0.08 μW |
| 2 | 0.5 V | 5.3 μA | 2.6 μW | 0.11 μW |
| 3 | 0.6 V | 7.0 μA | 4.2 μW | 0.17 μW |

From these measurements it can be seen that the complementary memory cell offers ultra-low power operation for gallium arsenide static RAMs in the range of 50-200 nW per cell. In this particular circuit configuration, the memory stack was the only element to utilize the complementary circuit and achieved a power dissipation of 100 nW/cell. With n channel E-JFET peripheral circuitry, the access time was 5 ns. The cell size was 50 microns×66 microns with complementary devices geometry of L=1 micron W=10 microns. These saturation drain currents of the n- and p channel E-JFET's which had a gate voltage of 0.9 V are 350 and 90 microamps with nominal threshold voltage of $V_{TN}=+0.2$ V and $V_{TP}=0$ V respectively. The standby power for a 4 K memory stack will be, therefore, around 0.4 mW with an estimated access time in the range of 5-10 ns.

What is claimed is:

1. A process for forming a GaAs integrated circuit structure containing complementary enhancement mode junction field effect transistors (JFET) comprising:

forming at least one n channel JFET structure in a first main surface of a semi-insulating GaAs substrate, the process for forming the n channel JFET comprising:

forming source and drain regions by a first ion implantation of n type impurity ions into two regions of the substrate separated by an intermediate region;

forming a channel region by exposing a portion of the intermediate region to a second ion implantation of further n type impurity ions, the second implantation also implanting into the source and drain regions; and forming a gate region by exposing a portion of the channel region to a third ion implantation of p type impurity ions; then emplacing electrical contacts atop the source, drain and gate regions; and forming at least one p channel JFET structure in said first main surface of the substrate, the process for forming the p channel structure comprising:

forming a p channel region by a channel ion implantation of p type impurity ions into the substrate;

forming source and drain regions by ion implantation of p type impurity ions into respective spaced-apart areas of the p channel region while protecting the remainder of the p channel region from this ion implantation; and forming a gate region by exposing a portion of the channel region intermediate the source and drain regions to an ion implantation of n type impurity ions; then forming electrical contacts atop the source, drain and gate regions wherein the ion implantations into the substrate pass through a protective layer of silicon-nitride sufficient to provide a consistent and fixed depth reference for the ion implantations, the protective layer being removed beneath at least the electric contacts.

2. The process of claim 1 wherein the protective layer comprises silicon nitride having a thickness of 1,000 angstroms.

3. The process of claim 1 further including the formation of an n channel resistive element comprising:

forming a first and second contact regions by a first ion implantation of n type impurity ions into said regions which are separated by an interposed region, said first ion implantation being substantially similar to the first ion implantation for the n channel JFET in implant energy and ion dosage amount; and forming a resistive channel region by a second ion implantation of n type impurity ions into a portion of the interposed region, said portion connecting the contact regions, wherein the ion dosage of this implant is less than that of the second ion implantation of the n channel JFET and at an effective level to achieve a desired level of resistance for the resistive element.

4. The process of claim 1 further including the formation of a p channel resistive element comprising:

forming first and second contact regions by a first ion implantation of p type impurity ions into said regions which are separated by an intervening region, said first ion implantation being substantially similar in implant energy and ion dosage to the source and drain implantation for the p channel JFET; and forming a resistive channel region by a second ion implantation of p type impurity ions into a portion of the intervening region, said portion connecting the contact regions, wherein the ion dosage of this implantation is less than that of the channel ion implantation for the p channel JFET and at an effective level to achieve a desired level of resistance for the resistive element.

* * * * *

UNITED STATES PATENT AND TRADEMARK OFFICE
CERTIFICATE OF CORRECTION

PATENT NO. : 4,679,298
DATED : 14 July 1987
INVENTOR(S) : Rainer Zuleeg, et al

It is certified that error appears in the above-identified patent and that said Letters Patent is hereby corrected as shown below:

In column 4, line 53, the word [$K_n' = 1 \times 10^{31\ 4}\ A/V_2$] should be $\underline{K_n' = 1 \times 10^{-4}\ A/V}_2$.

Signed and Sealed this

Twenty-eighth Day of March, 1989

Attest:

DONALD J. QUIGG

*Attesting Officer*      *Commissioner of Patents and Trademarks*